(12) United States Patent
Ehrenreich et al.

(10) Patent No.: US 7,755,408 B2
(45) Date of Patent: *Jul. 13, 2010

(54) REDUNDANCY IN SIGNAL DISTRIBUTION TREES

(75) Inventors: Sebastian Ehrenreich, Schoenau (DE); Juergen Koehl, Weil Im Schoenbuch (DE); Juergen Pille, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 324 days.

This patent is subject to a terminal disclaimer.

(21) Appl. No.: 11/868,637

(22) Filed: Oct. 8, 2007

(65) Prior Publication Data

US 2008/0256413 A1 Oct. 16, 2008

Related U.S. Application Data

(63) Continuation of application No. 11/350,149, filed on Feb. 8, 2006, now Pat. No. 7,336,115.

(30) Foreign Application Priority Data

Feb. 9, 2005 (EP) .................................. 05100905

(51) Int. Cl.
*G06F 1/04* (2006.01)
*H03K 1/04* (2006.01)

(52) U.S. Cl. ................... 327/291; 327/293; 327/295; 326/93; 326/10

(58) Field of Classification Search ......... 327/291–299; 326/93

See application file for complete search history.

(56) References Cited

U.S. PATENT DOCUMENTS

| 4,812,684 | A | 3/1989 | Yamagiwa et al. |
| 5,396,129 | A | 3/1995 | Tabira |
| 6,020,774 | A | 2/2000 | Chiu et al. |
| 6,252,449 | B1 * | 6/2001 | Hanriat ........................ 327/295 |
| 6,542,017 | B2 | 4/2003 | Manganaro |
| 6,822,500 | B1 * | 11/2004 | Warnock et al. ............. 327/295 |
| 6,838,922 | B2 | 1/2005 | Melcher |
| 7,233,186 | B2 * | 6/2007 | Ishimi .......................... 327/291 |
| 2004/0100316 | A1 * | 5/2004 | Yamamoto ................... 327/291 |
| 2006/0170479 | A1 * | 8/2006 | Hirata et al. ................. 327/295 |

* cited by examiner

*Primary Examiner*—Vibol Tan
(74) *Attorney, Agent, or Firm*—Steven Chiu

(57) ABSTRACT

A signal distribution tree structure for distributing signals within a plurality of signal tree branches to a plurality of signal sinks, wherein the signal in subsequent sub trees (11) is driven by a preceding amplifier (2), which is characterized in that the amplifiers are logic gates (3), which combines the signals of a preferred input (31) connected to a preceding logic gate in the signal path with a signal of a secondary input (32) connected to an adjacent tree (12) path of a neighboring and/our preceding sub tree.

12 Claims, 9 Drawing Sheets

REDUNDANCY IN SIGNAL DISTRIBUTION TREES

CROSS-REFERENCE TO RELATED APPLICATIONS

Figure 1:
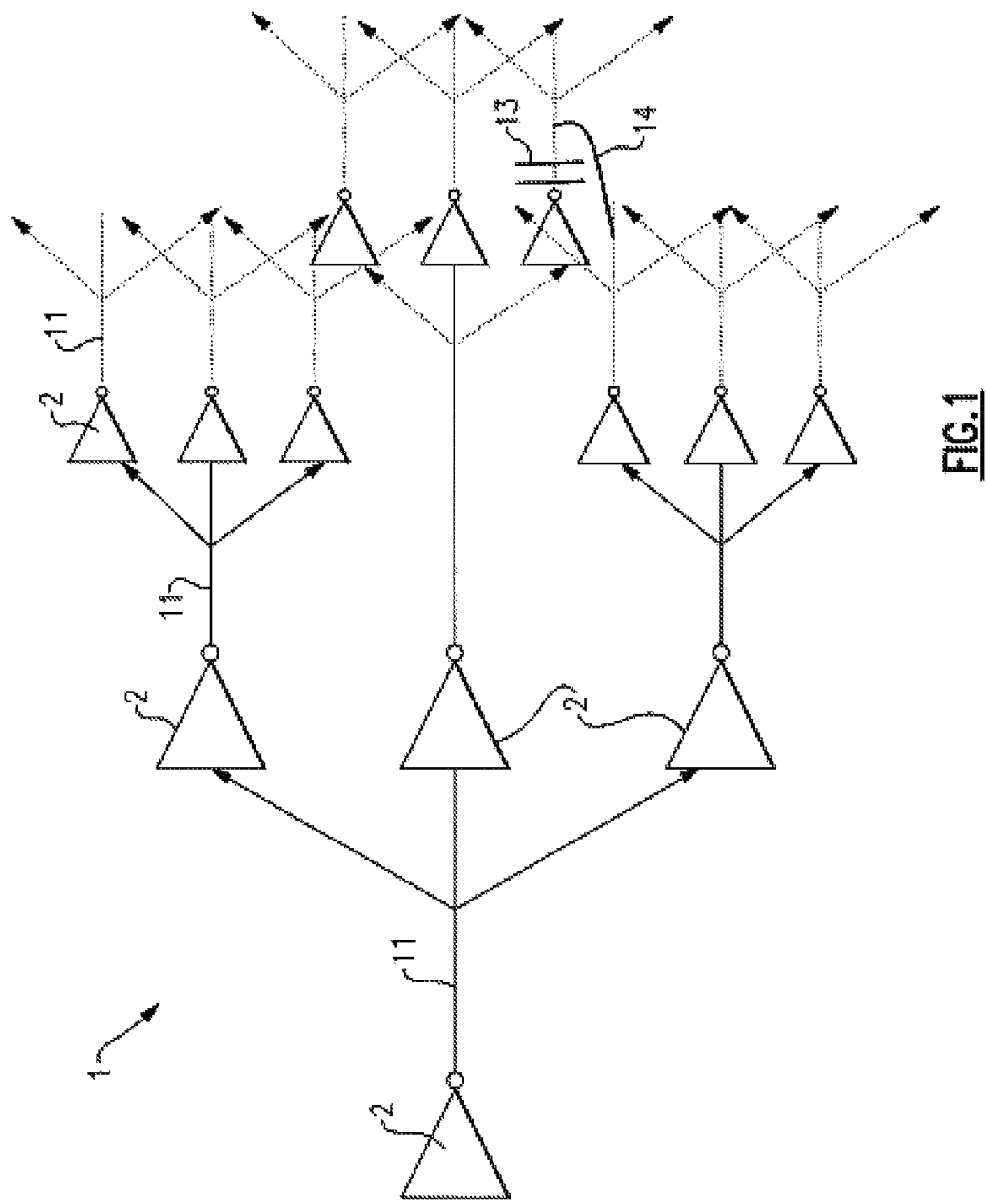

This application is a continuation of U.S. patent application Ser. No. 11/350,149 filed Feb. 8, 2006 now U.S. Pat. No. 7,336,115, entitled "REDUNDANCY IN SIGNAL DISTRIBUTION TREES", which claims priority from European Patent Application No. 05100905.8, filed Feb. 9, 2005, both of which are hereby incorporated herein try reference in their entirety.

TECHNICAL FIELD OF THE INVENTION

The present invention relates to a signal distribution tree structure for distributing signals within a plurality of signal tree branches to a plurality of signal sinks, wherein the signal in subsequent sub trees is driven by a preceding amplifier. Further the invention relates to a method for redundant distribution of a signal in a signal distribution, tree structure.

BACKGROUND OF THE INVENTION

In chip production a lot of defects are caused by faulty wiring which has its origin in the wiring technology in particular if long distances on the chip has to be spanned.

For example wire and via opens are the major cause for defects in integrated circuit technologies used for wiring signal lines.

Those signal, routings are in particular on VLSI chips implemented as trees, Such signal distribution tree structures for distributing signals, .i.e. reset-signals, axe developed as a plurality of signal tree sub branches to a lot of signal sinks.

For example VLSI designs typically contain high fan out signals that are distributed by buffer trees. Reset trees often distribute a signal to 100's of thousands of sinks, These distribution trees are broken dawn for electrical reasons to 10's of thousands of nets (distribution sub trees) with an average fan-out up to 100 pins.

If an open, an interruption of the signal conducting wiring, occurs in a single data line, the net causes a failure. Even if the rest of the distribution net would function properly. This would be the cause of a defect of the whole chip.

TECHNICAL PURPOSE OF THE INVENTION

The purpose of the invention is to develop a signal distribution tree structure that can overcome faults in signal wiring on the chip by sophisticated redundancy precautions.

DISCLOSURE OF THE INVENTION AND ITS ADVANTAGES

The first part of the invention's technical purpose is met by the proposed signal distribution tree structure for distributing signals within a plurality of signal tree branches to a plurality of signal sinks, wherein the signal in subsequent sub trees is driven by a preceding amplifier, that is characterized in that, the amplifiers are logic gates, which combines the signals of a preferred input connected to a preceding logic gate in the signal path with a signal of a secondary input connected to an adjacent tree path of a neighboring and/or preceding sub tree.

Thereby the terra logic gate also comprises circuits that can compare or compute input, states of different inputs.

The proposed embodiment of the invention derives its benefits form the correct signal value that is still available in adjacent, logically equivalent sub trees.

The logic gates are preferably 2-way NAND- or NOR-gates.

Preferably the signal of the adjacent tree path of neighboring and/or preceding sub trees has the same logical distance from the common source or equivalent source.

In a preferred embodiment of the invention, the preferred, input is connected with a protection circuitry that pull the preferred input to a defined state in case of an interruption of the signal line before the preferred input.

Said protection circuitry can comprise a high resistive bleeder/pull-up device connecting a voltage source of a defined level with the preferred input of the logic gate.

In a preferred embodiment of the invention, the high resistive bleeder/pull-up device is a permanently driven transistor, whose source is connected to the voltage source of the defined level and whose drain is connected to the preferred input of the logic gate. The advantage in this conception lies in the very simple and in the place-savings on the chip surface.

In another preferred embodiment of the invention, a level holding device is connected to the preferred input of the logic gate which holds the preferred input at a defined level after it is pulled to such one.

Said level holding device can comprises an inverter, whose input is connected to the preferred input of the logic gate and whose output drives & transistor whose source is connected to the voltage source of the defined level and whose drain is connected to the preferred input of the logic gate.

In another preferred embodiment of the invention, the high resistive bleeder/pull-up device is a transistor whose source is connected to the voltage source of the defined level, whose drain is connected to the preferred input of the logic gate and whose gate is driven by a power-on-reset signal for a period of time until the preferred input, of the logic gate is safely driven to the defined level. One of the benefits of this embodiment is that there are no unwanted currents while normal operating.

A signal generation circuit can be provided, according to another preferred embodiment of the invention, which generates the power-on-reset signal until, the output of the logic gate switches for the first time from its initial level to another.

In a preferred embodiment of the invention, the high resistive bleeder/pull-up device is a load transistor whose source is connected to the voltage source of a defined first level, whose drain is connected to the preferred input of the logic gate and whose gate is driven fey an analyzing circuitry.

Advantageously said, analyzing circuitry can drive the load transistor during a power-on-reset sequence whereby faulty open signal wiring causes pulling of the preferred input of the logic gate to the defined first level whereas correct wiring holds the preferred input on a second level.

Said analyzing circuitry can comprise means to analyze the signal level of the preferred input of the logic gats after the power-on-reset sequence and drives the load, transistor permanently in case that the preferred input is on the defined first level.

In an additional preferred embodiment of the invention, said protection circuitry and/or said analyzing circuitry and/or said level holding device is provided at each input of the logic gate.

Another part of the invention is met by a method for redundant distribution of a signal in a signal distribution tree structure with a plurality of signal tree branches to a plurality of signal sinks, wherein the signal in subsequent sub trees is driven by a preceding amplifier, which is characterized in, that the amplifiers are chosen as logic gates, and that the logic gates combine the signals of a preferred input connected to a preceding logic gate in the signal path with a signal of a secondary input connected to an adjacent tree path of a neighboring and/or preceding sub tree.

The foregoing, together with other objects, features, and advantages of this invention can be better appreciated with reference to the following specification, claims and drawings.

BRIEF DESCRIPTION OF THE DRAWINGS, WITH

Figure 2:
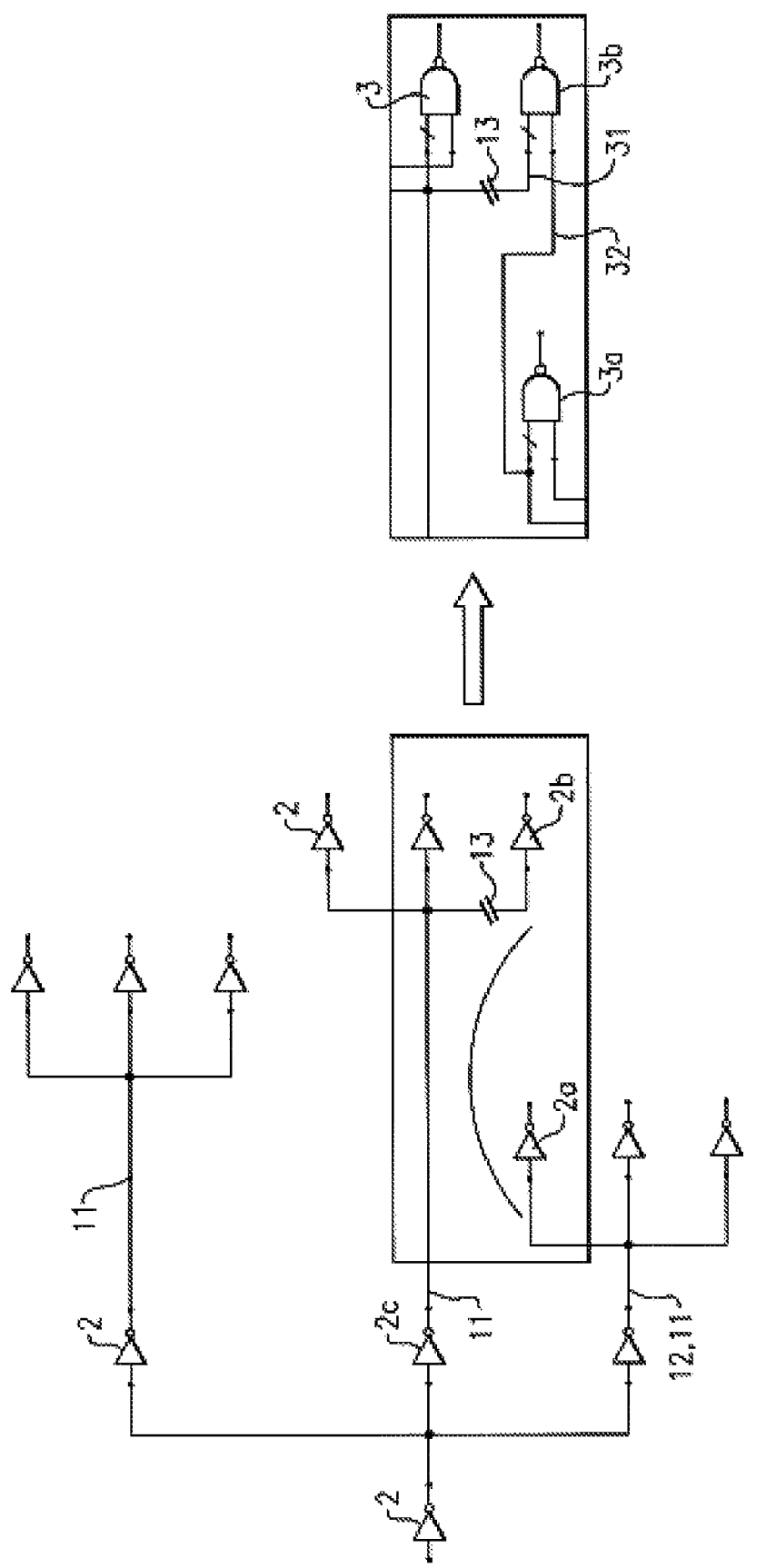
Figure 3:
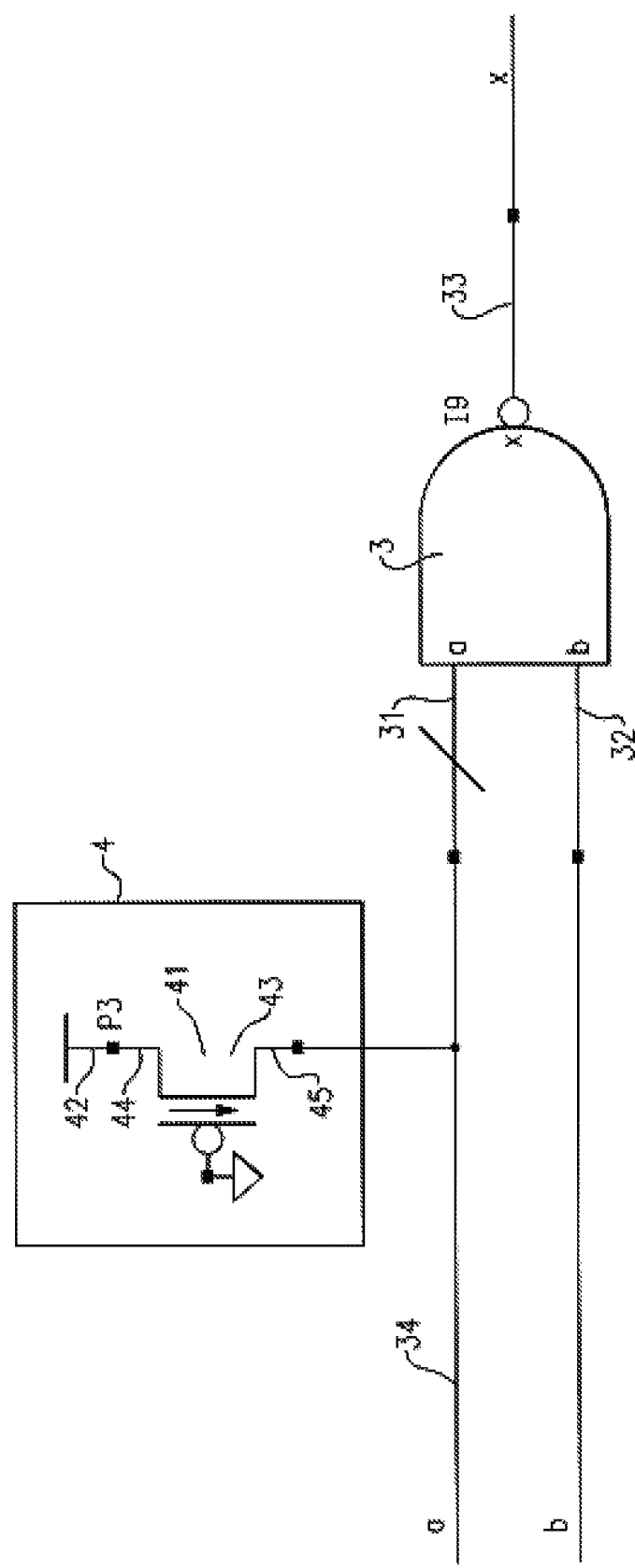
Figure 4:
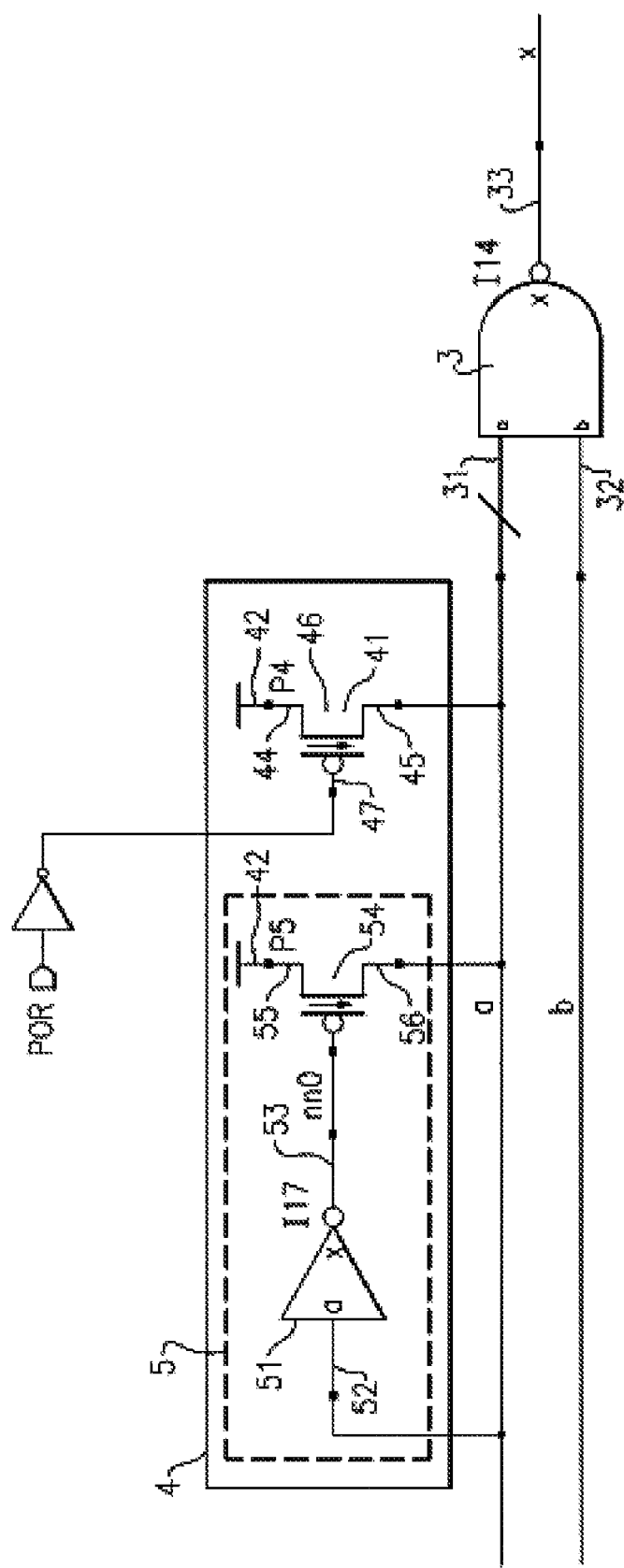
Figure 5:
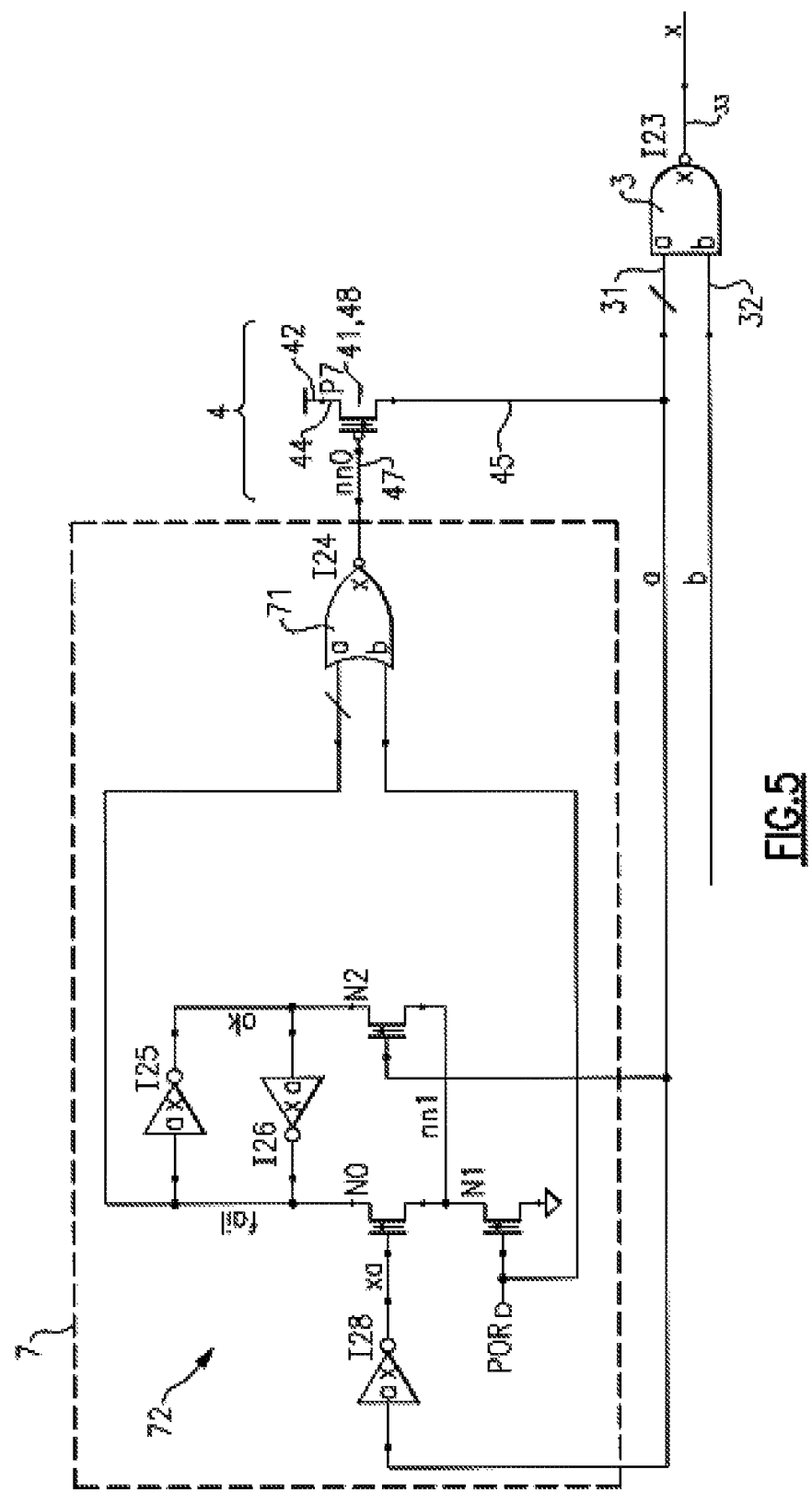
Figure 6:
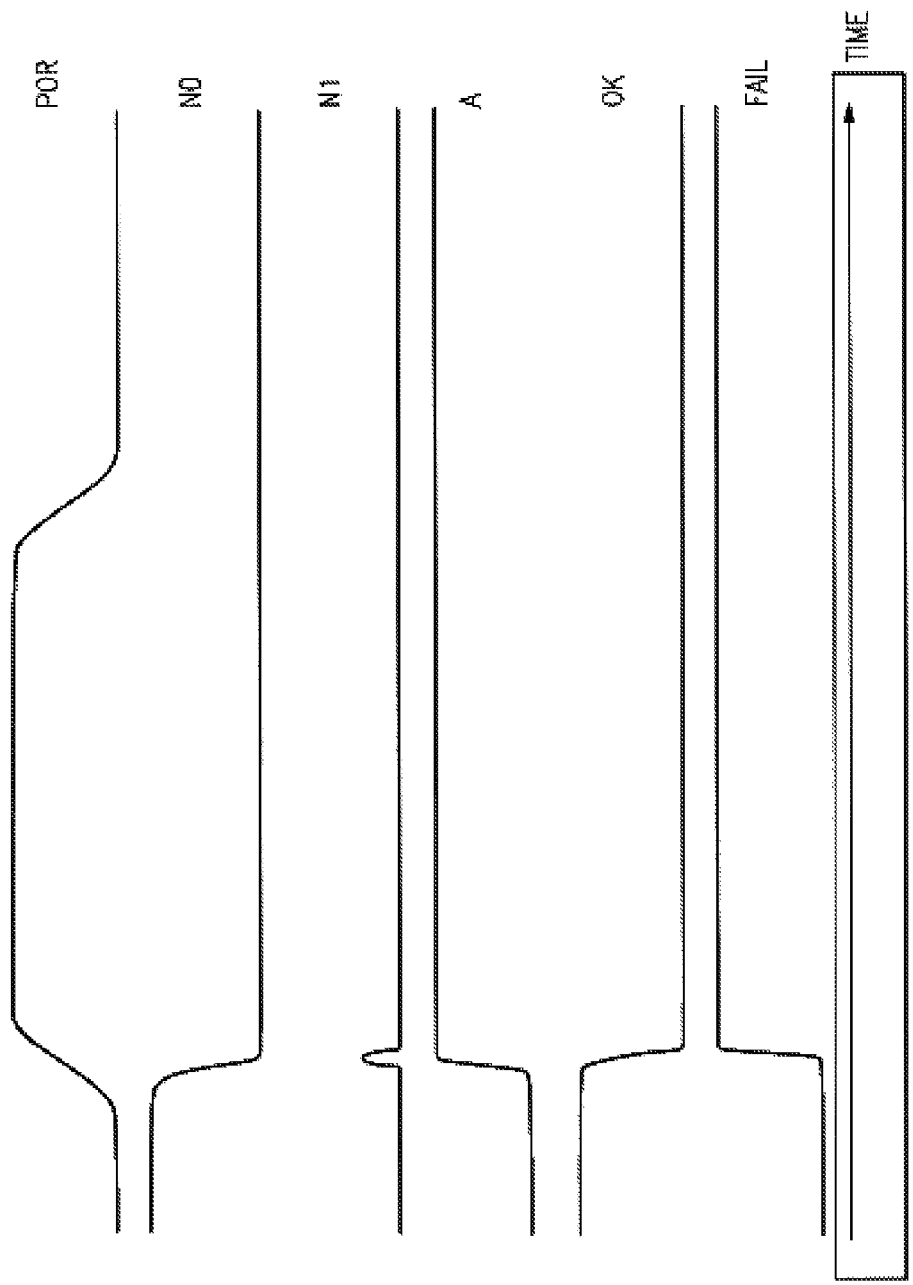
Figure 7:
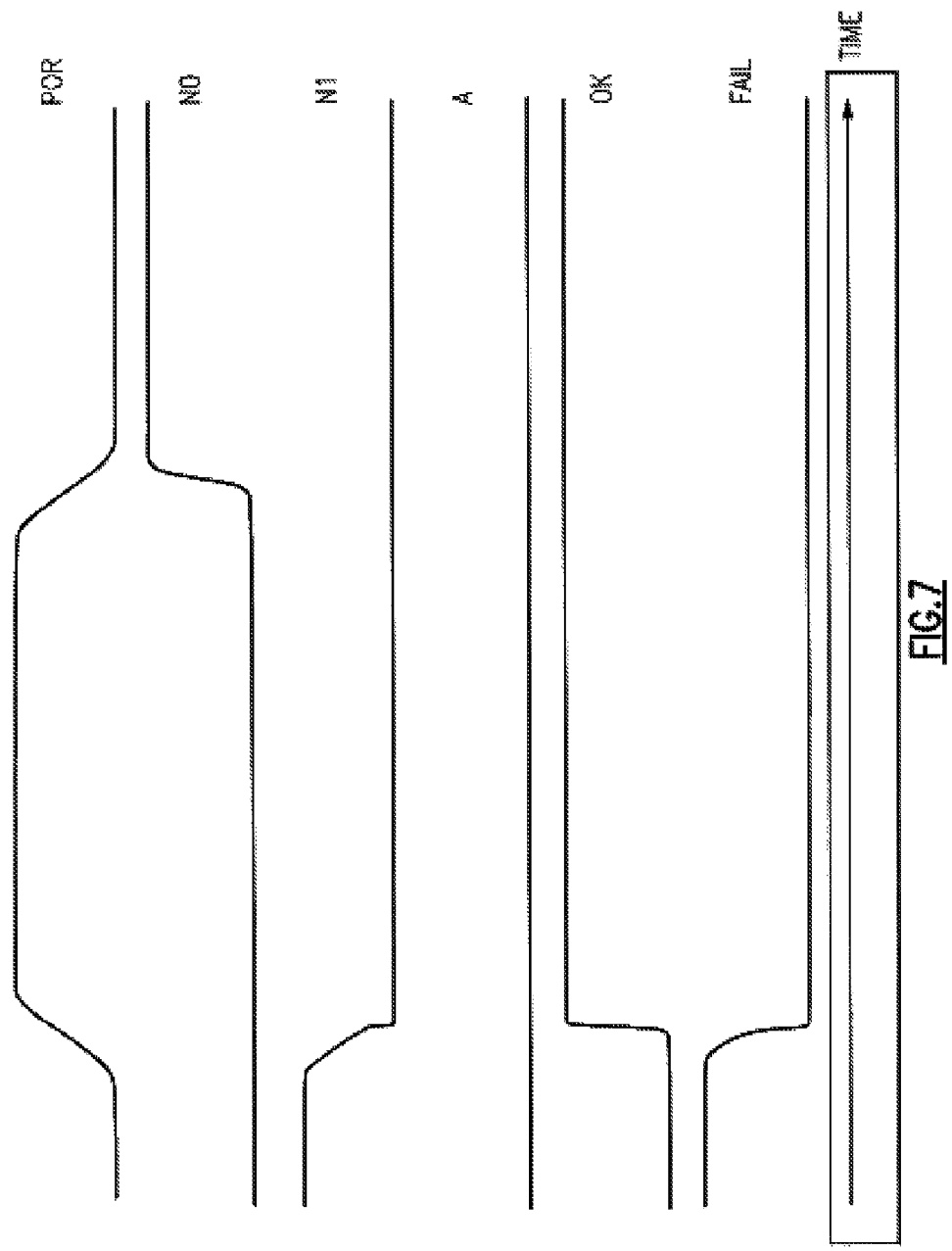
Figure 8:
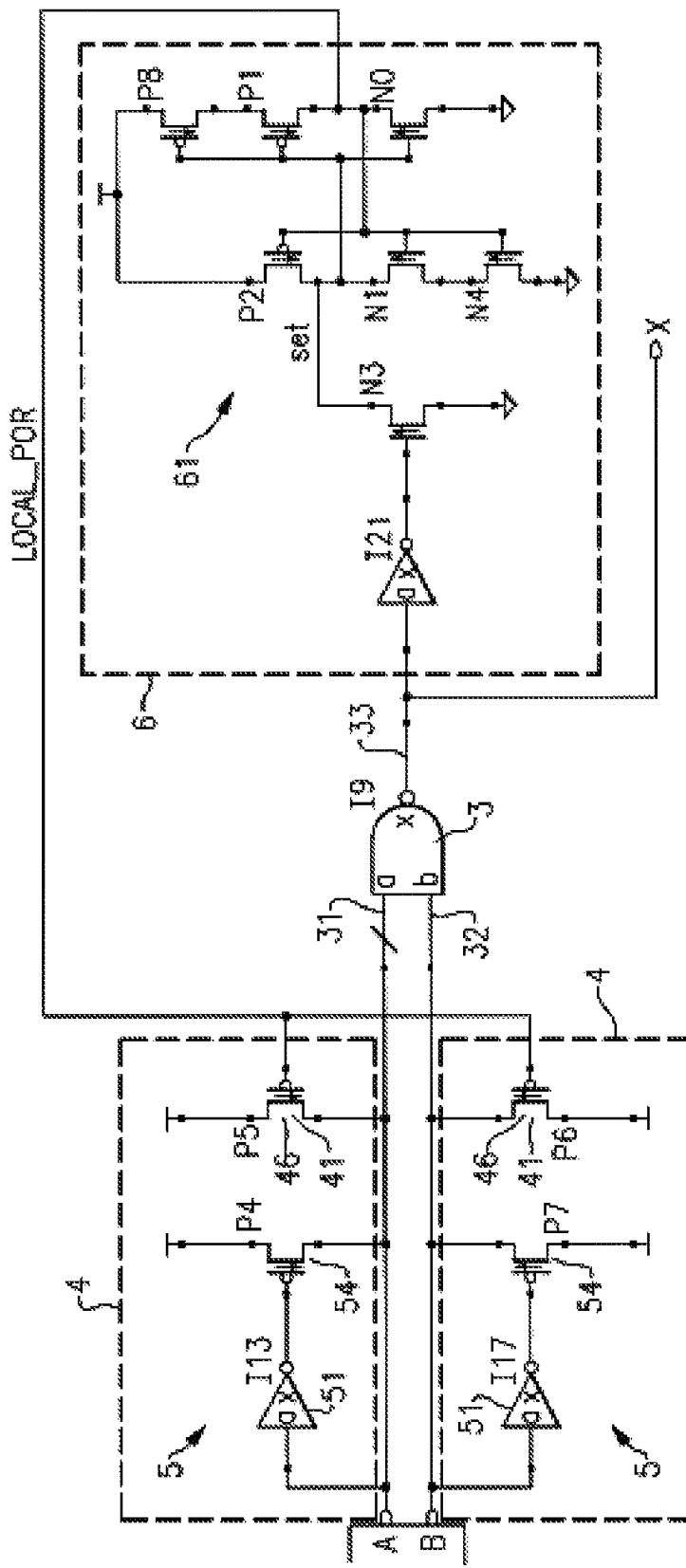
Figure 9:
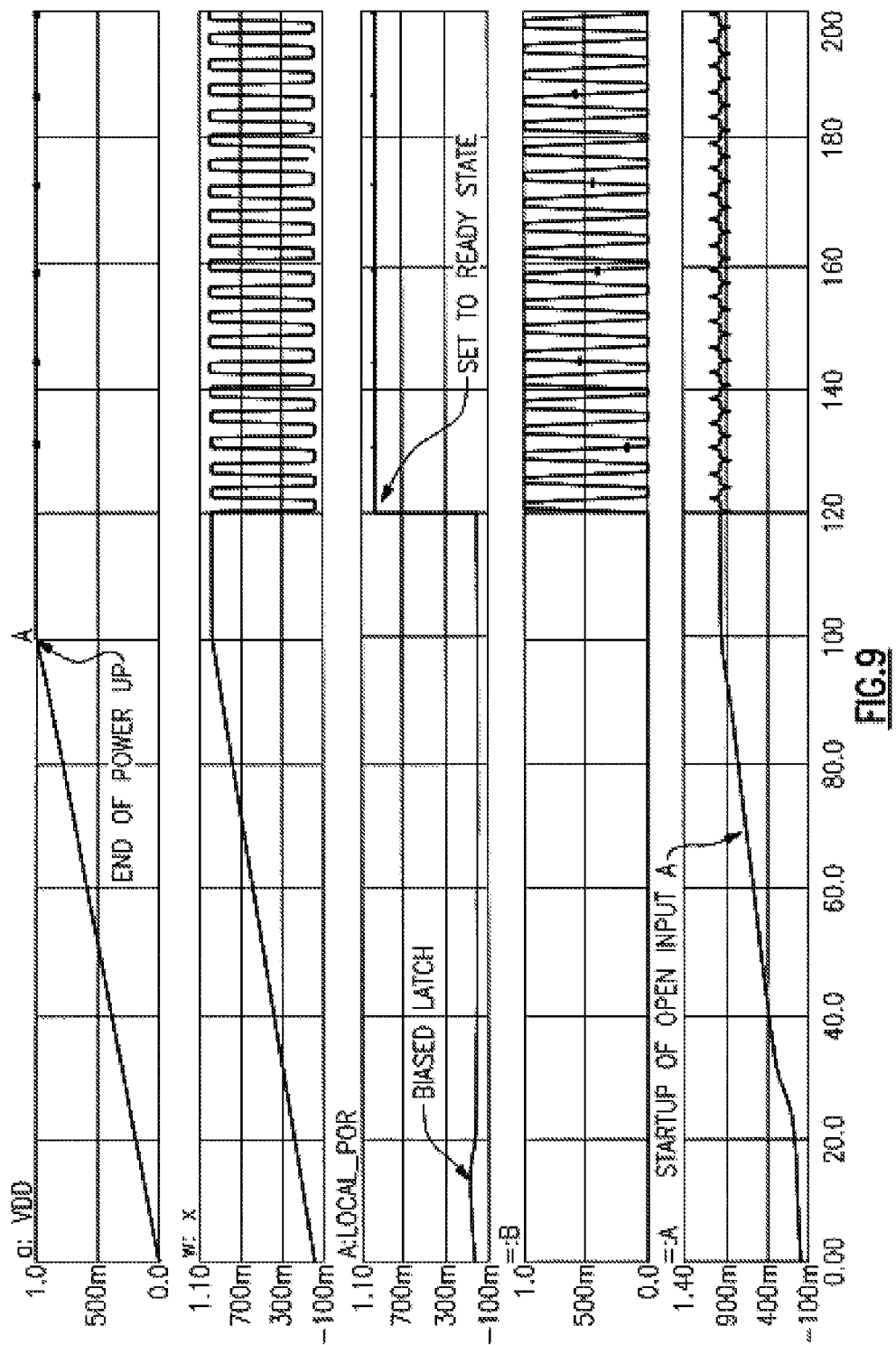

FIG. 1 showing a scheme of a state-of-the-art signal distribution tree structure where an interruption is bypassed by a redundant signal line, FIG. 2 showing the scheme from FIG. 1, where a detailed figure shows the redundant wiring and use of logic gates according to the invention, FIG. 3 showing a scheme of a logic gate with a protection device according to the invention, FIG. 4 showing a scheme of & logic gate with a protection device and a level holding device according to the invention, FIG. 5 showing a scheme of a logic gate with a protection device and a analyzing circuitry driving that protection device, FIG. 6 showing a schematic waveform diagram of the levels of the signals of the circuitry according to FIG. 5, in the case that an wiring fault exists, FIG. 7 showing a schematic waveform diagram of the levels of the signals of the circuitry according to FIG. 5, in the case that no wiring fault exists, FIG. 8 showing a scheme of a logic gate with a protection device and a analyzing circuitry driving that protection device and a level holding device together with a signal generation circuit, and FIG. 9 showing a schematic waveform diagram of the signals of the circuitry according to FIG. 8.

DETAILED DESCRIPTION OF THE INVENTION

FIG. 1 depicts a scheme of a state-of-the-art signal distribution tree structure 1 with for distributing signals within a plurality of signal tree branches to a plurality of signal sinks (not shown). The signal in subsequent sub trees 11 is driven in each, sub tree by a preceding amplifier 2, implemented as an inverter or buffer.

An exemplary interruption 13 is bypassed by a redundant signal line 14.

In FIG. 2 the amplifiers 2 are replaced by logic gates, in particular NAND-gates. At these logic gates two signal, tree branches can be used as an input.

The logic gate 3b (amplifier 2b) for example combines the signal of the preceding logic gate (amplifier 2c) and the signal of the logic gate 3a (amplifier 2a) of a neighboring signal sub tree 12.

A preferred input 31 of the logic gate 3b (could be a fast input) is connected to the preceding logic gate in the signal path, and a secondary input 32 is connected to a preferred input of the logic gate 3a of the adjacent tree 12 analogously.

With this technique to combine signals, the functionality of the whole distribution net is always ensured, even if wiring faults/interruptions occur. In case one of the input nets is floating due to a defect during production the other signal tree would take control.

To guarantee proper function in case of an open, the floating net can be forced to a logical '1' (or vdd) so that the NAND-gate, has a safe properly defined state.

The invention proposes a method for redundant distribution of a signal in a signal distribution tree structure with a plurality of signal tree branches to a plurality of signal sinks, wherein the signal in subsequent sub trees is driven by a preceding amplifier, wherein the amplifiers are chosen as logic gates 3, which logic gates combine the signals of a preferred input 31 connected to a preceding logic gate in the signal path with a signal of a secondary input 32 connected to an adjacent tree 12 path of a neighboring and/or preceding sub tree.

FIG. 3 shows a protection circuitry 4, which is connected to the preferred input 31 of the logic gate, that pulls the preferred input 31 to a defined state in case of a interruption of the signal line 34 before the preferred input 31 causing floating of the signal level.

The described protection circuitry can be provided on both inputs 31 and 32 of the logic gate. The implementation shown uses a NAND circuit as the logic gate. Other gates like nor circuits can he used, which require to reverse the polarity of the control.

The protection circuitry 4 comprise a permanently driven transistor 43 (p-FET) as a high resistive bleeder/pull-up device 41 according to the invention, connecting a voltage source 42 of a defined level with the preferred input 31 of the logic gate 3.

The source 44 is therefore connected to the voltage source 42 of the defined level (vdd) and its drain 45 is connected to the preferred input 31 of the logic gate 3. The gate is connected to gnd, turning the transistor always on acting as a bleeder device.

In case the wiring before the preferred input has no flaw, it is advantageous that a level holding device 5 as shown in FIG. 4 is connected to the preferred input 31 of the logic gate 3.

The level holding device 5 holds the preferred input 31 at a defined level if it is pulled to such one, regardless whether the signal was correctly pulled by the preceding logic gate or the bleeder/pull-up device 41.

The exemplary level holding device 5 comprises an inverter 51, whose input 52 is connected, to the preferred input 31 of the logic gate 3 and whose output 53 drives a transistor 54 whose source 55 is connected to the voltage source 42 of the defined level (vdd, logic "1") and whose drain 56 is connected to the preferred input 31 of the logic gate 3.

The bleeder/pull-up device 41 is embodied by a transistor 46 whose source 44 is connected to the voltage source 42 of the defined level (vdd) and whose drain 45 is connected to the preferred input 31 of the logic gate 3. The gate 47 of the transistor 46 is driven by a power-on-reset signal 'por' for a period of time until the preferred input 31 of the logic gate 3 is safely driven to the defined level. In case of flawless wiring the bleeder/pull-up device could not pull the signal line 'A' together with the preferred input 31 to logic "1" (vdd) if a logic "0" (gnd) is fed by the preceding logic gate to the line, because of the high ohmic characteristics of the bleeder/pull-up device.

The level holding device 5 acting as a halflatch actively holds the preferred input at the correct level after the power-on-reset signal por goes low.

A different solution according to the invention is shown in FIG. 5. In this embodiment the high bleeder/pull-up device 41 is embodied by a load transistor 48 whose source 44 is connected to the voltage source 42 of a defined first level {high, vdd}, whose drain 45 is connected to the preferred input 31 of the logic gate 3 and whose gate 47 is driven by an analyzing circuitry 7. The analyzing circuitry 7 detects the state of the signal line 'A' connected to the preferred input 31 (functional or floating) and sets a hold-device accordingly.

As in the before discussed embodiment there is a generated power-on-reset signal 'por' needed, while the signal distribution tree has to he initialized advantageously in a way that all sub trees hold a defined value, in this case a "0" {or gnd}.

When power-on-reset signal 'por' is active (high), the transistor 48 is driven by a NOR-gate 71, which is fed with the power-on-reset signal.

The gate 47 of the transistor 48 is driven for a period of time until the preferred input 31 of the logic gate 3 is safely driven to the defined level.

The transistor 48 tries to charge the preferred input 31 to vdd. In case the data line connected to the preferred input 31 is floating it goes high and initializes a latch 72 of the analyzing circuitry 7 by setting a "ok" node to low and a 'fail' node to high.

When 'fail' is high, the transistor 48 is permanently driven by the NOR-gate 71 which is fed with the high 'fail'-signal The 'fail' bit information as described can be read out for analysis purposes by a scan chain to locate and/or identify the sub tree containing an open. The scan circuitry is not shown but several concepts are well in the art of circuit design.

The hits can also foe used in a sequence of signal distribution sub tree structures containing OR-gates to detect if there is any open on this particular chip at all.

To determine the precise sub tree causing the fault, two test circuits have to be connected to a net;

At first the circuits shown in FIG. 5 to test an open for an initial value of '0': Bit 1.

Second a mirrored version to teat an open for an initial value of '1' Bit 2

The combination of the two fail bits (Bit 1, Bit 2) can be interpreted as:

a. (0,0)=no open or stuck at fault.
b. (1,1)=open
c. (1,0)=stuck at '1'
d. (0,1)=stuck at '0'

FIG. 6 shows a schematic waveform diagram of the levels of the signals of the circuitry according to FIG. 5 in case that an interruption in the wiring is present.

When the signal line ('A') connected to the preferred input 31 is functional the transistor 48 is not able to overcome the driving device, keeping the signal line 'A' together with the preferred input 31 low, and setting the latch 72 to 'ok=1' and 'fail=0'.

In this case the driving of the transistor 48 by the NOR-gate 71 stops after the power-on-reset signal por goes also low after the end of the initialization sequence.

One of the advantages of this embodiments is, that the latch holds the state of the signal line 'A' and only activates the hold device (transistor 48) when necessary, as a result no latching behavior occurs in case the latch is functional.

FIG. 7 shows a schematic waveform diagram of the levels of the signals of the circuitry according to FIG. 5 in case that the wiring is flawless.

In case of flawless wiring the bleeder/pull-up device 41 could not pull the line 'A' and preferred input 31 to logic "1" (vdd) if a logic "0" is fed by the preceding logic gate to the line 'A'.

FIG. 8 shows a scheme of another embodiment of the invention. In this embodiment both inputs 31 and 32 are provided with a level holding device 5 and a bleeder/pull-up device 46 according to FIG. 4. Hereby an even higher redundancy and snore reliable operation is ensured.

The functionality is the same as described above in FIG. 4f however for both inputs 31 and 32 of the logic gate 3.

To generate locally a power-on-reset signal "local_por", which drives the transistors 46 as bleeder/pull-up devices 41, a signal generation circuit & is provided which generates the local power-on-reset signal local_por on a signal line LOCAL_POR until the output 33 of the logic gate 3 switches for the first time from its initial level to another.

The signal generation circuit 6 comprises a biased latch 61 build of transistors P1, P2, P8, N0, N1 and N4. The bias is achieved by using stacked devices N1/N4 and P1/P8, i.e. the latch initializes in a preferred state (local$_{por}$=0) during power up.

If there is an open on an input 31 or 32 (signal line 'A' or 'B'), i.e. the signal lines "A" and 'B' together with the inputs 31 and 32 are not actively driven to logic '0' or '1', they are set to '1' (vdd) by transistor P5 and PS respectively.

Once a logic high level on the signal lines 'A' or 'E' is reached, this level is kept by the holding devices 5 respectively, When both inputs 31, 32 and the signal lines 'A' and 'B' are logic '1', the output of the logic gate 3 (NAND-gate) switches to logic "0" and therefore transistor N3 begins to conduct and sets the biased latch in the 'ready' state (local_por=1) by pulling down node 'set'.

In case of inputs 'A' or 'B' are actively driven to logic the transistors P5/P6 are not strong enough to rise the level of the signal lines. 'A' or 'B' , The 'ready' state is reached after the first positive edge on both inputs 'A' and 'B'.

In the following, both start-up transistors P5 and P6 are switched off (see diagram of the signals in FIG. 9).

FIG. 9 shows a diagram of the signals of the generated local power-on-reset signal "local_por", the output 33 (connected to signal line 'X')and of the inputs 31 (connected to signal line 'A') and 32 (connected to signal line 'B') of the logic gate 3 from power-up in an example where the signal line 'A' has a defect.

The main advantage in this embodiment is, that there is no requirement to generate an external power-on-reset signal and so startup-devices are only active during the power-up period.

An additional advantage of the embodiments shown in FIG. 6 and FIG. 8 is the detection of opens in the wiring of integrated circuits and determining the precise sub tree that has this open.

The state-of-the-art approaches of generating test patterns to analyze faults in integrated circuits does not show the root cause (short, open) of the defect without further analysis. The invention will generate this information for every sub tree that is connected to the proposed circuit structure of the invention,

COMMERCIAL APPLICABILITY

The invention is commercially applicable particularly in the field of production, test and the operation of integrated chips in a wide field of applications in integrated chip technology since signal distribution is a needed technique.

What is claimed is:

1. A signal distribution tree structure for distributing signals within a plurality of signal tree branches to a plurality of signal sinks, wherein a signal in subsequent sub trees is driven by a preceding amplifier, wherein the amplifiers are logic gates, which combines the signals of a preferred input connected to a preceding logic gate in the signal path with a signal of a secondary input connected to an adjacent tree path of a neighboring and/or preceding sub tree, wherein the preferred input is connected with protection circuitry that pulls the preferred input to a defined state in case of an interruption of the signal line before the preferred input.

2. The signal distribution tree structure according to claim 1, wherein said logic gates are 2-way NAND or NOR gates.

3. The signal distribution tree structure according to claim 1, wherein said protection circuitry comprises a high resistive bleeder/pull-up device connecting a voltage source of a defined level with the preferred input of the logic gate.

4. The signal distribution tree structure according to claim 3, wherein the high resistive bleeder/pull-up device is a permanently driven transistor whose source is connected to the voltage source of the defined level and whose drain is connected to the preferred input of the logic gate.

5. The signal distribution tree structure according to claim 1, wherein a level holding device is connected to the preferred input of the logic gate which holds the preferred input at a defined level.

6. The signal distribution tree structure according to claim 5, wherein the level holding device comprises an inverter, whose input is connected to the preferred input of the logic gate and whose output drives a transistor whose source is connected to the voltage source of the defined level and whose drain is connected to the preferred input of the logic gate.

7. The signal distribution tree structure according to claim 3, wherein the high resistive bleeder/pull-up device is a transistor whose source is connected to the voltage source of the defined level, whose drain is connected to the preferred input of the logic gate and whose gate is driven by a power-on-reset signal for a period of time until the preferred input of the logic gate is safely driven to the defined level.

8. The signal distribution tree structure according to claim 7, wherein a signal generation circuit is provided which generates the power-on reset signal (por) until the output of the logic gate switches for the first time from its initial level to another.

9. The signal distribution tree structure according to claim 3, wherein the high resistive bleeder/pull-up device is a load transistor whose source is connected to the voltage source of a defined first level, whose drain is connected to the preferred input of the logic gate and whose gate is driven by an analyzing circuit.

10. The signal distribution tree structure according to claim 9, wherein said analyzing circuitry drives the load transistor during a power-on-reset sequence whereby faulty open signal wiring causes pulling of the preferred input of the logic gate to the defined first level whereas correct wiring holds the preferred input on a second level.

11. The signal distribution tree structure according to claim 10, wherein said analyzing circuitry comprises means to analyze the signal level of the preferred input of the logic gate after the power-on-reset sequence and drives the load transistor permanently in case the preferred input is on the defined first level.

12. The signal distribution tree structure according to claim 1, wherein said protection circuitry and/or said analyzing circuitry and/or said level holding device is provided at each input of the logic gate.

\* \* \* \* \*